United States Patent
Okuno et al.

(10) Patent No.: US 7,851,854 B2
(45) Date of Patent: Dec. 14, 2010

(54) SIC SEMICONDUCTOR DEVICE HAVING BOTTOM LAYER AND METHOD FOR MANUFACTURING THE SAME

(75) Inventors: Eiichi Okuno, Mizuho (JP); Naohiro Suzuki, Anjo (JP); Nobuyuki Kato, Nisshin (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/318,183

(22) Filed: Dec. 23, 2008

(65) Prior Publication Data

US 2009/0166730 A1    Jul. 2, 2009

(30) Foreign Application Priority Data

Dec. 26, 2007 (JP) ............................ 2007-334104

(51) Int. Cl.
*H01L 29/78* (2006.01)
*H01L 21/336* (2006.01)

(52) U.S. Cl. .................. 257/330; 257/332; 257/342; 257/E29.262; 257/E21.41; 257/E29.169; 438/270; 438/272; 438/286

(58) Field of Classification Search .......... 257/301, 257/328–332, 341, 342, 77, 354, 339, E29.169, 257/E21.066, E29.04, E29.084, E29.104, 257/E29.128, E21.054; 438/270, 44, 40, 438/931, 552, 243, 212, 286, 268, 271, 335, 438/336, 589

See application file for complete search history.

(56) References Cited

U.S. PATENT DOCUMENTS

2009/0032821 A1*   2/2009   Onose et al. .................. 257/77
2009/0072241 A1*   3/2009   Harris et al. .................. 257/77

FOREIGN PATENT DOCUMENTS

JP    A-2001-267570    9/2001

* cited by examiner

*Primary Examiner*—Victor A Mandala
*Assistant Examiner*—Whitney Moore
(74) *Attorney, Agent, or Firm*—Posz Law Group, PLC

(57) ABSTRACT

A SiC semiconductor device includes: a substrate; a drift layer on the substrate; a trench on the drift layer; a base region in the drift layer sandwiching the trench; a channel between the base region and the trench; a source region in the base region sandwiching the trench via the channel; a gate electrode in the trench via a gate insulation film; a source electrode coupled with the source region; a drain electrode on the substrate opposite to the drift layer; and a bottom layer under the trench. An edge portion of the bottom layer under a corner of a bottom of the trench is deeper than a center portion of the bottom layer under a center portion of the bottom of the trench.

20 Claims, 10 Drawing Sheets

SIC SEMICONDUCTOR DEVICE HAVING BOTTOM LAYER AND METHOD FOR MANUFACTURING THE SAME

CROSS REFERENCE TO RELATED APPLICATION

This application is based on Japanese Patent Application No. 2007-334104 filed on Dec. 26, 2007, the disclosure of which is incorporated herein by reference.

FIELD OF THE INVENTION

The present invention relates to a SiC semiconductor device having a bottom layer under a trench and a method for manufacturing a SiC semiconductor device having a bottom layer under a trench.

BACKGROUND OF THE INVENTION

A SiC semiconductor device having a trench gate type vertical power device is well known. Specifically, the power device made of SiC has high breakdown electric field strength. Since the SiC material has high breakdown electric field strength, the power device made of SiC can control large current. Accordingly, the power device made of SiC is suitably used for motor control in a hybrid vehicle.

When a large current flows through the power device, a channel density should be increased. In a silicon transistor, a trench gate type vertical power MOSFET is used. The structure in the silicon based power MOSFET may be used for the SiC power device. However, in this case, there are the following difficulties.

The breakdown electric field strength of the SiC material is ten times larger than that of the Si material. Accordingly, a voltage to be applied to the SiC material is ten times larger than a voltage to be applied to the Si material. The voltage is also applied to a gate insulation film disposed in a surface portion in a trench of the SiC material, and is ten times larger than that of the Si material. Accordingly, the gate insulation film may be broken down at a corner of the trench gate.

In JP-A-2001-267570, when a trench gate type MOSFET is manufactured, a P conductive type dopant is implanted just after a trench is formed. Thus, a P conductive type bottom layer is formed on a bottom of the trench gate.

However, an on-state resistance is changed in accordance with a distance from a bottom of a P conductive type base region to the P conductive type bottom layer. The inventors have studied about a trench gate type MOSFET as a related art. FIG. 11 shows a SiC semiconductor device having a P conductive type bottom layer 4 as a simulation model according to a related art. FIG. 12 shows a simulation result of a relationship between an on-state resistance and a protrusion amount L. The protrusion amount L is defined as a distance from a bottom of a P conductive type base region 3 in the SiC semiconductor device to the P conductive type bottom layer 4. The protrusion amount L is equal to a distance between the bottom of the base region 3 and the bottom of the trench 5.

As shown in FIG. 12, when the protrusion amount L is sufficiently large, the on state resistance becomes constant. When the protrusion amount L is small, the on state resistance increases. Specifically, when the protrusion amount L is smaller than 0.2 μm, the on state resistance rapidly increases. When the protrusion amount L is narrow, a distance between depletion layers extending from the P conductive type base region 3 and the P conductive type bottom layer 4 to the N conductive type channel layer 15 and the N conductive type drift layer 2 becomes narrow. Accordingly, as the protrusion amount L is smaller, the on state resistance becomes larger.

Thus, it is required for a SiC semiconductor device having a P conductive type bottom layer on a bottom of a trench to reduce a on state resistance.

SUMMARY OF THE INVENTION

In view of the above-described problem, it is an object of the present disclosure to provide a SiC semiconductor device having a bottom layer under a trench. It is another object of the present disclosure to provide a method for manufacturing a SiC semiconductor device having a bottom layer under a trench.

According to a first aspect of the present disclosure, a SiC semiconductor device having an accumulation type MOSFET includes: a substrate having a first conductive type and made of SiC; a drift layer having the first conductive type and made of SiC, wherein the drift layer is disposed on the substrate, and has an impurity concentration lower than an impurity concentration of the substrate; a trench disposed on a surface of the drift layer; a base region having a second conductive type and made of SiC, wherein the base region is disposed in a surface portion of the drift layer, and sandwiches the trench; a channel having the first conductive type and made of SiC, wherein the channel is disposed between the base region and a sidewall of the trench; a source region having the first conductive type and made of SiC, wherein the source region is disposed in a surface portion of the base region, and sandwiches the trench via the channel; a gate insulation film disposed on an inner wall of the trench; a gate electrode disposed in the trench via the gate insulation film; a source electrode electrically coupled with the source region; a drain electrode disposed on the substrate opposite to the drift layer; and a bottom layer having the second conductive type and made of SiC, wherein the bottom layer is disposed under the trench. The MOSFET flows current between the source electrode and the drain electrode via the source region, the channel and the drift layer by controlling a voltage to be applied to the gate electrode. The bottom layer includes an edge portion and a center portion. The edge portion of the bottom layer is disposed under a corner of a bottom of the trench, and the center portion of the bottom layer is disposed under a center portion of the bottom of the trench. The edge portion of the bottom layer is deeper than the center portion of the bottom layer.

In the above device, a top of a depletion layer extending from the edge portion of the bottom layer to the drift layer becomes deeper, so that a distance between the depletion layer extending from the bottom layer to the drift layer and a depletion layer extending from the base region to the drift layer becomes wide. Therefore, even when a protrusion amount is small, an on state resistance is limited from increasing. Thus, the SiC semiconductor device has a small on state resistance.

According to a second aspect of the present disclosure, a SiC semiconductor device having an inversion type MOSFET includes: a substrate having a first conductive type and made of SiC; a drift layer having the first conductive type and made of SiC, wherein the drift layer is disposed on the substrate, and has an impurity concentration lower than an impurity concentration of the substrate; a trench disposed on a surface of the drift layer; a base region having a second conductive type and made of SiC, wherein the base region is disposed in a surface portion of the drift layer, and sandwiches the trench to contact a sidewall of the trench; a source region having the first conductive type and made of SiC, wherein the source region is disposed in a surface portion of the base region, and sandwiches the trench to contact the sidewall of the trench; a gate insulation film disposed on an inner wall of the trench; a gate electrode disposed in the trench via the gate insulation film; a source electrode electrically coupled with the source region; a drain electrode disposed on the substrate opposite to the drift layer; and a bottom layer having the second conductive type and made of SiC, wherein the bottom layer is disposed under the trench. The MOSFET provides a channel in a part of the base region contacting the sidewall of the trench by controlling a voltage to be applied to the gate electrode. The MOSFET flows current between the source electrode and the drain electrode via the source region, the channel and the drift layer. The bottom layer includes an edge portion and a center portion. The edge portion of the bottom layer is disposed under a corner of a bottom of the trench, and the center portion of the bottom layer is disposed under a center portion of the bottom of the trench. The edge portion of the bottom layer is deeper than the center portion of the bottom layer.

In the above device, even when a protrusion amount is small, an on state resistance is limited from increasing. Thus, the SiC semiconductor device has a small on state resistance.

According to a third aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a plurality of base regions in a surface portion of the drift layer by implanting a second conductive type impurity on the surface portion of the drift layer, wherein each base region has a second conductive type, and the plurality of base regions is spaced apart from each other; forming a source region in a surface portion of each base region, wherein the source region having the first conductive type and made of SiC has an impurity concentration higher than the impurity concentration of the drift layer; forming a trench on a surface of the drift layer by an ICP etching method, wherein the trench is disposed between the plurality of the base regions, and spaced apart from each base region, and the trench is deeper than the base region; forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer; covering at least the edge portion of the bottom layer with a first conductive type SiC material; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

According to a fourth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a plurality of base regions in a surface portion of the drift layer by implanting a second conductive type impurity on the surface portion of the drift layer, wherein each base region has a second conductive type, and the plurality of base regions is spaced apart from each other; forming a source region in a surface portion of each base region, wherein the source region having the first conductive type and made of SiC has an impurity concentration higher than the impurity concentration of the drift layer; forming a trench on a surface of the drift layer by an ICP etching method, wherein the trench is disposed between the plurality of the base regions, and spaced apart from each base region, and the trench is deeper than the base region; forming a mask on the bottom of the trench, wherein a corner of a bottom of the trench is exposed from the mask, and the mask covers a center portion of the bottom of the trench; forming a bottom layer under the trench by implanting a second conductive type impurity through the mask, wherein the bottom layer has the second conductive type and includes an edge portion and a center portion, the edge portion of the bottom layer is disposed under the corner of the bottom of the trench, the center portion of the bottom layer is disposed under the center portion of the bottom of the trench, and the edge portion of the bottom layer is deeper than the center portion of the bottom layer; removing the mask; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

According to a fifth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a bottom layer in a surface portion of the drift layer by implanting a second conductive type impurity on the drift layer, wherein the bottom layer has a second conductive type and a predetermined depth from the surface of the drift layer; forming a plurality of base regions in another surface portion of the drift layer by implanting the second conductive type impurity on the drift layer, wherein each base region has the second conductive type, the plurality of base regions sandwiches the bottom layer, each base region is spaced apart from the bottom layer, and the base region is shallower than the bottom layer; forming a source region in a surface portion of each base region, wherein the source region having the first conductive type and made of SiC has an impurity concentration higher than the impurity concentration of the drift layer; forming a trench on the surface portion of the drift layer by an ICP etching method so that a part of the bottom layer is removed and a remaining part of the bottom layer is disposed under the trench, wherein the trench is disposed between the plurality of the base regions, and spaced apart from each base region, and the trench is deeper than the base region; covering at least an edge portion of the bottom layer with a first conductive type SiC material, wherein the edge portion of the bottom layer is disposed under a corner of a bottom of the trench; forming a gate insulation film on an inner wall of the trench; forming a gate electrode in the trench via the gate insulation film; forming a source electrode electrically coupled with the source region; and forming a drain electrode on the substrate opposite to the drift layer. The bottom layer further includes a center portion, the center portion of the bottom layer is disposed under a center portion of the bottom of the trench, and the edge portion of the bottom layer is deeper than the center portion of the bottom layer.

The above method provides the SiC semiconductor device such that even when a protrusion amount is small, an on state resistance is limited from increasing. Thus, the SiC semiconductor device has a small on state resistance.

According to a sixth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a base region in a surface portion of the drift layer, wherein the base region has a second conductive type; forming a source region in a surface portion of the base region, wherein the source region having the first conductive type and made of SiC has an impurity concentration higher than the impurity concentration of the drift layer; forming a trench on a surface of the drift layer by an ICP etching method, wherein the trench penetrates the base region and the source region and reaches the drift layer; forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer; covering at least the edge portion of the bottom layer with a first conductive type SiC material; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A SiC semiconductor device having a vertical power device such as a trench gate type accumulation MOSFET according to a first embodiment will be explained as follows.

Figure 1:
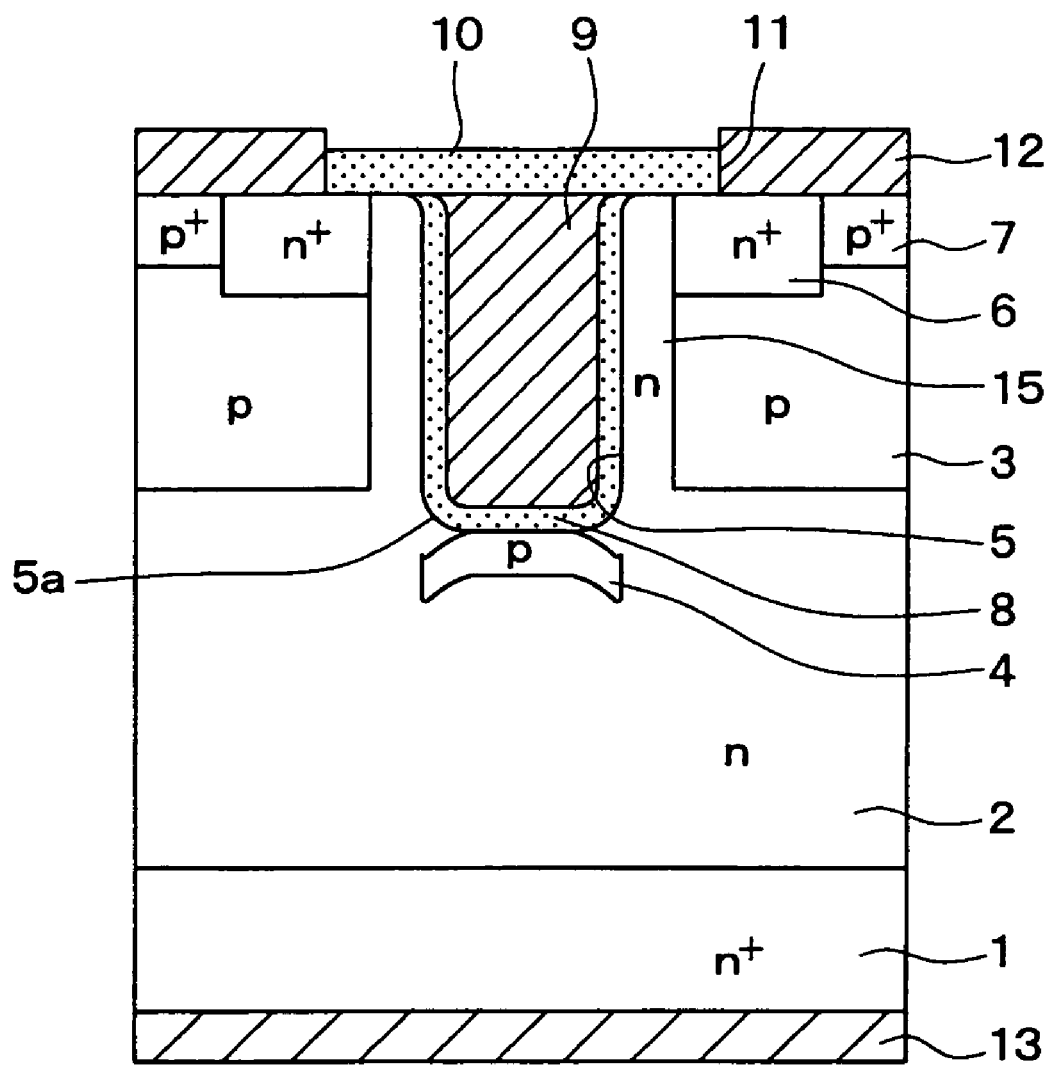
FIG. 1 is a diagram illustrating a cross sectional view of an accumulation type MOSFET according to a first embodiment.

In FIG. 1, a planar type MOSFET is formed in a N+ conductive type substrate 1 made of SiC. The substrate 1 has a thickness of 300 μm and a principal surface. The substrate 1 has an impurity concentration of $1 \times 10^{19}$ cm$^{-3}$. The impurity in the substrate 1 is, for example, nitrogen.

A N conductive type drift layer 2 is epitaxially formed on the principal surface of the substrate 1. The drift layer 2 is made of SiC. The drift layer 2 has an impurity concentration of $1 \times 10^{16}$ cm$^{-3}$, and a thickness of 10 μm. The impurity in the drift layer 2 is, for example, nitrogen.

Multiple P conductive type base regions 3 are formed in a surface portion of the drift layer 2. The base regions 3 are arranged spaced apart from each other. The base regions 3 are formed by an ion implantation method. The impurity concentration of each base region 3 is in a range between $1 \times 10^{17}$ cm$^{-3}$ and $2 \times 10^{19}$ cm$^{-3}$. Preferably, the impurity concentration of each base region 3 is $1 \times 10^{17}$ cm$^{-3}$. The thickness of the base region 3 is in a range between 0.4 μm and 1.0 μm. Preferably, the thickness of the base region 3 is 0.7 μm. The P conductive type impurity in the base region 3 is, for example, aluminum.

A P conductive type bottom layer 4 is formed in the drift layer 2 such that the P conductive type bottom layer 4 is disposed under the base region 3, and spaced apart from the base region 3. The P conductive type bottom layer 4 is formed under the bottom of the trench 5. A part of the P conductive type bottom layer 4 facing a corner 5a of the trench 5 is disposed under another part of the P conductive type bottom layer 4 facing a center of the bottom of the trench 5. Specifically, the part of the P conductive type bottom layer 4 has a position, which is deeper than a position of the other part of the P conductive type bottom layer 4. The other part of the P conductive type bottom layer 4 faces a center portion of the bottom of the trench 5, the center portion which is disposed inside of the corner 5a. The part of the P conductive type bottom layer 4 is spaced apart from the bottom of the trench 5 at the corner 5a of the bottom of the trench 5. The other part of the P conductive type bottom layer 4 contacts the center portion of the bottom of the trench 5, which is disposed inside of the corner 5a of the trench 5. The impurity concentration of the P conductive type bottom layer 4 is, for example, in a range between $5 \times 10^{16}$ cm$^{-3}$ and $2 \times 10^{19}$ cm$^{-3}$. Preferably, the impurity concentration of the P conductive type bottom layer 4 is $1 \times 10^{17}$ cm$^{-3}$. The width of the P conductive type bottom layer 4 along with a direction parallel to the surface of the substrate 1 is substantially equal to the bottom of the trench 5.

The trench 5 is formed between the P conductive type base regions 3. The trench 5 is formed to be deeper than the bottom of the P conductive type base region 3. The corner 5a of the bottom of the trench 5 is rounded by a rounding process. The protrusion amount L from the bottom of the P conductive type base region 3 to the bottom of the trench 5 may be a predetermined value. Preferably, the protrusion amount L is equal to or larger than 0.2 μm. The sidewall of the trench 5 is separated from the P conductive type base region 3 by a predetermined distance. The N conductive type drift layer 2 is arranged between the sidewall of the trench 5 and the P conductive type base region 3. A part of the drift layer 2 between the sidewall of the trench 5 and the P conductive type base region 3 functions as a channel 15.

A plurality of N$^+$ conductive type source regions 6 is disposed in the surface portion of the base region 3. The source regions 6 are separated from each other with the trench 5. The source region 6 has a high impurity concentration equal to or larger than $3 \times 10^{20}$ cm$^{-3}$. For example, the impurity concentration of the source region 6 is $1.0 \times 10^{21}$ cm$^{-3}$. The depth of the source region 6 is in a range between 0.3 μm and 0.4 μm. For example, the depth of the source region 6 is 0.3 μm.

A P conductive type contact layer 7 is formed over the base region 3. In this embodiment, the contact layer 7 is formed in a surface portion of the base region 3. The contact layer 7 has a surface impurity concentration of about $1.0 \times 10^{21}$ cm$^{-3}$. The depth of the contact layer 7 is about 0.3 μm.

The gate oxide film 8 as a gate insulation film having a thickness of, for example, 52 nm is formed on an inner wall of the trench 5. The gate oxide film 8 may be formed at 1200° C. by a wet-thermal oxidation method such as a pyrogenic method and a bubbling method. Alternatively, the gate oxide film 8 may be formed from a deposition film such as a TEOS film and a LTO film. When the gate oxide film 8 is formed of a deposition film, the deposition film may be processed under a wet thermal step at 1200° C. so that a trench interface is electrically coupled with the deposition film. When the gate oxide film 8 is formed by the thermal oxidation process and/or the thermal process, a falling temperature step under a wet condition is performed after the thermal step at 1200° C. is performed. Preferably, the wet condition may be maintained under a temperature equal to or smaller than 800° C. Specifically, the wet condition is maintained under a temperature equal to or smaller than 600° C., the device has an interface with a good condition.

The gate electrode 9 is formed on the surface of the gate oxide film 8. The gate electrode 9 is made of poly silicon with a N conductive type impurity as a dopant such as phosphorous. The gate electrode is embedded in the trench 5.

The interlayer insulation film 10 made of BPSG is formed to cover the gate electrode 9 and a top of the gate oxide film 8. A contact hole 11 for connecting to the source region 6 and the contact layer 7 is formed in the interlayer insulation film 10. Further, another contact hole for connecting to the gate electrode 9 is formed in the interlayer insulation film 10 and/or the gate oxide film 8. A source electrode 12 is formed to electrically connect to the source region 6 and the contact layer 7 via the contact hole 11. Further, a gate wiring (not shown) is formed to electrically connect to the gate electrode 9 via the other contact hole. The source electrode 12 and the gate wiring are made of, for example, Ti and/or Al.

A drain electrode 13 is formed on a backside of the substrate 1 so that the drain electrode 13 provides a backside electrode made of Ni or the like. Thus, the MOSFET is constructed.

In the MOSFET, when the drain electrode 13 is set to be 2 volts, the gate electrode 15 volts, and the source electrode 12 volts in a normal operation, i.e., in an on state, a channel 15 is formed at a portion of the drift layer 2 contacting the trench 5. The channel 15 is an accumulation layer and provides a current path so that the current flows between the source region 6 and the drift layer 2 and the substrate 1 via the current path. The source region 6 is disposed on an upstream side of the current path, and the drift layer 2 and the substrate 1 are disposed on a downstream side of the current path. The current between the source region 6 and the drift layer 2 and the substrate 1 is controlled by controlling a voltage to be applied to the gate electrode 9 and by controlling a width of the depletion layer in the channel 15 so as to control the current therethrough.

Figure 11:
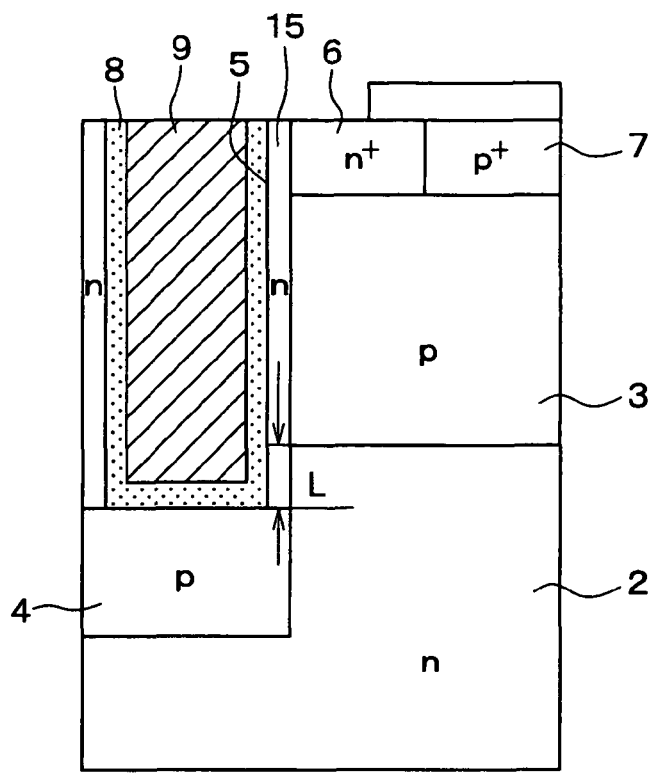
FIG. 11 is a diagram illustrating a cross sectional view of a SiC semiconductor device having a P conductive type bottom layer according to a related art.
Figure 12:
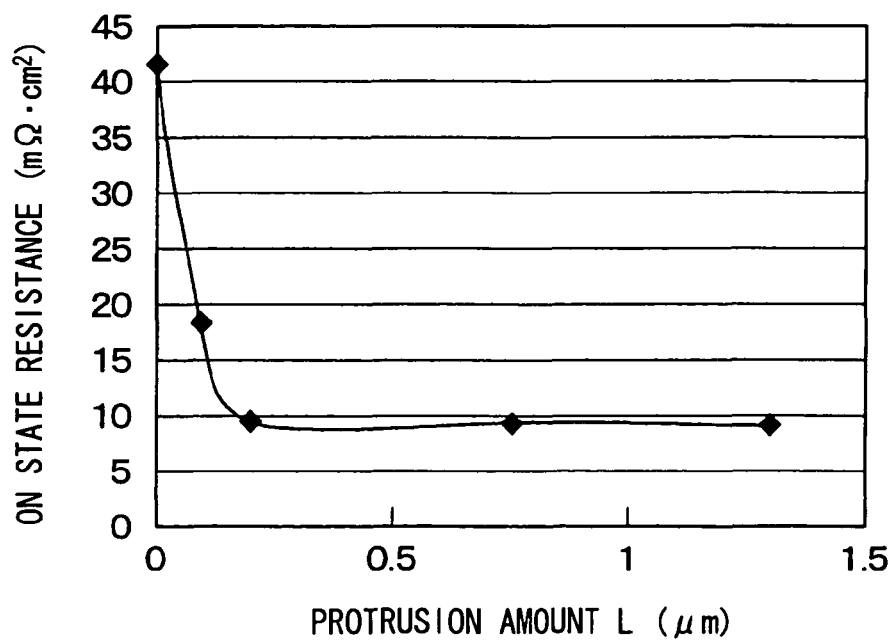
FIG. 12 is a diagram illustrating a graph of a relationship between a protrusion amount and an on state resistance in the SiC semiconductor device shown in FIG. 11.

In the MOSFET, the part of the P conductive type bottom layer 4 facing the corner 5a of the trench 5 is disposed deeper than the center part of the P conductive type bottom layer 4. Accordingly, the depletion layer extending from the P conductive type bottom layer 4 to the drift layer 2 has an up end, which is deeper than that in a case where the P conductive type bottom layer 4 has a top flat surface shown in FIG. 11. Accordingly, the distance between the depletion layer extending from the P conductive type bottom layer 4 to the drift layer 2 and the depletion layer extending from the base region 3 to the drift layer 2 becomes wide, compared with a case where the P conductive type bottom layer 4 has a top flat surface in FIG. 11. Thus, even when the protrusion amount I is small, the on state resistance is limited from increasing. The SiC semiconductor device having the P conductive type bottom layer 4 on the bottom of the trench 5 has a low on state resistance.

Figure 2A:
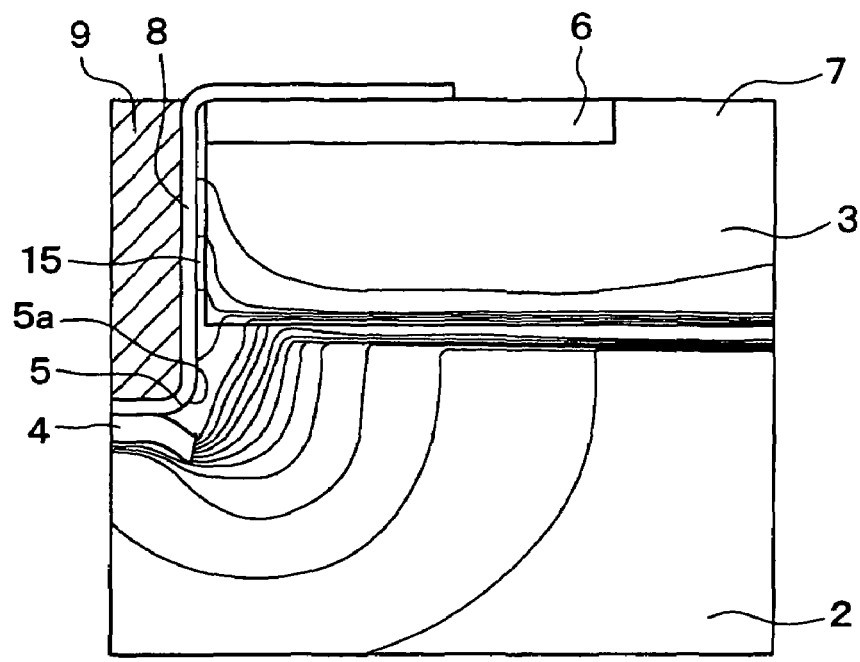
FIG. 2A is a diagram illustrating a distribution of an equipotential line in the MOSFET based on a simulation result.
Figure 2B:
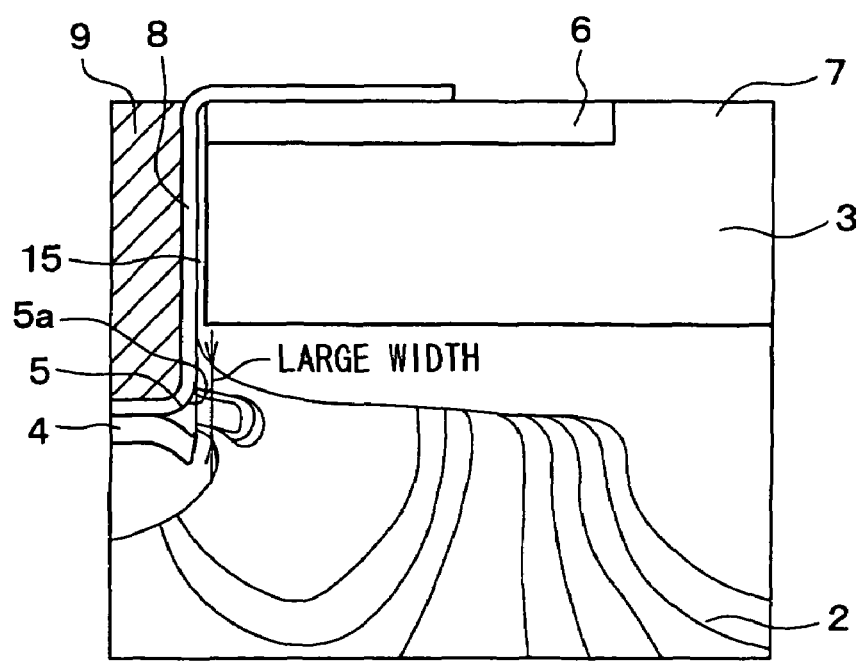
FIG. 2B is a diagram illustrating a distribution of current density in the MOSFET.
Figure 3A:
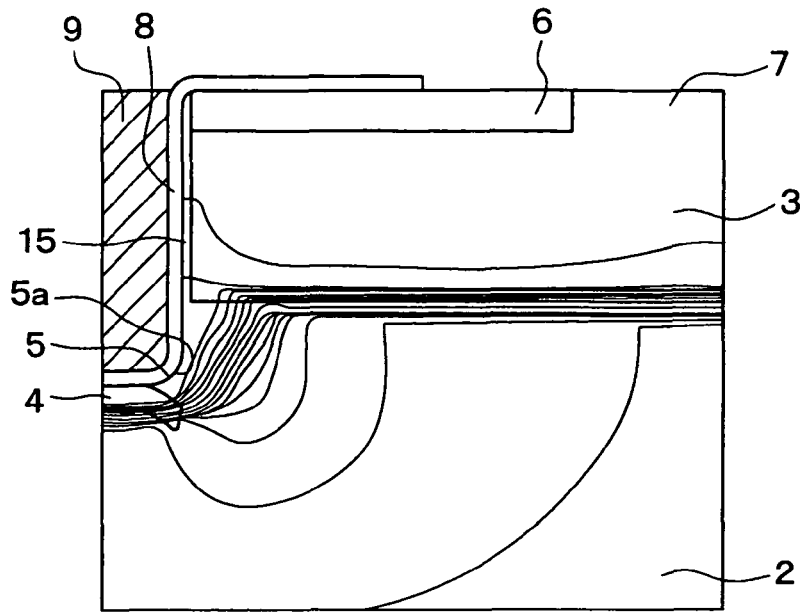
FIG. 3A is a diagram illustrating a distribution of an equipotential line in a MOSFET based on a simulation result.
Figure 3B:
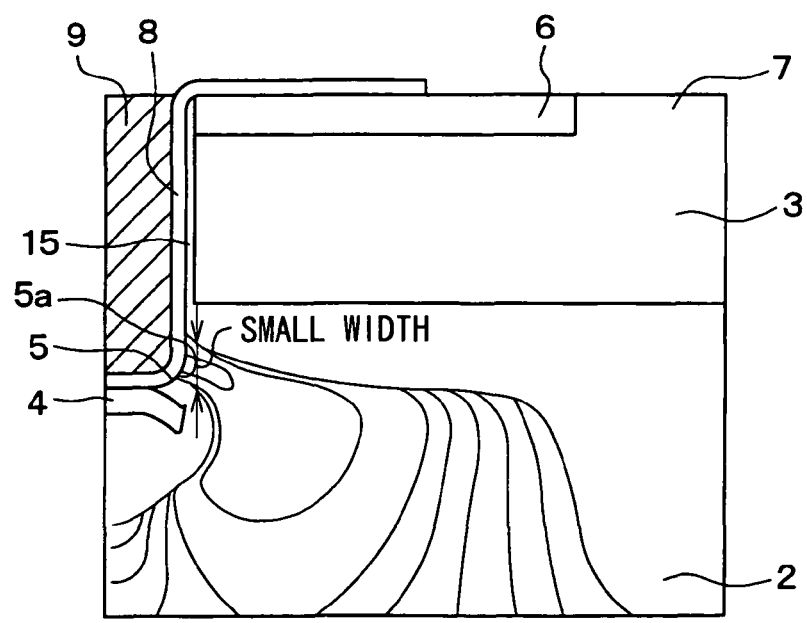
FIG. 3B is a diagram illustrating a distribution of current density in the MOSFET, according to a related art.

FIG. 2A shows a distribution of an equipotential line in the MOSFET, and FIG. 2B shows a distribution of current density in the MOSFET. Here, the protrusion amount L is set to be a certain value, and the drain electrode 13 is set to be 1 volt. The interval between adjacent two equipotential lines in FIG. 2A is 0.05 volts. FIG. 3A shows a distribution of an equipotential line in a MOSFET having the P conductive type bottom layer 4 with the top flat surface, and FIG. 3B shows a distribution of current density in the MOSFET as a comparison according to a related art. Here, the protrusion amount L is set to be a certain value, and the drain electrode 13 is set to be 1 volt. The interval between adjacent two equipotential lines in FIG. 2A is 0.05 volts.

The special distance between two adjacent equipotential lines in FIG. 2A near the corner 5a of the trench 5 becomes wider than that in FIG. 3A. Further, a width of a region, at which the current density is high, in FIG. 2B is wider than that in FIG. 3B. The width of the region is defined along with a vertical direction, and the protrusion amount L is also defined along with the vertical direction. The on state resistance of the MOSFET shown in FIGS. 2A and 2B is 4.2 Ω·cm$^2$. The on state resistance of the MOSFET shown in FIGS. 3A and 3B is 6.6 Ω·cm$^2$. Thus, the on state resistance in the MOSFET in FIGS. 2A and 2B is smaller than that in FIGS. 3A and 3B.

FIGS. 4A to 5C show a manufacturing method of the MOSFET in FIG. 1.

Figure 4A:
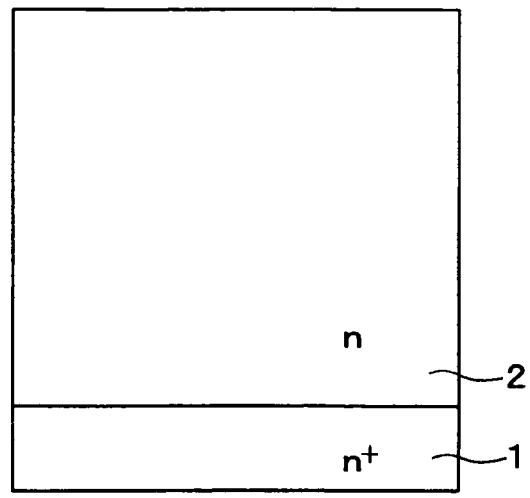
FIG. 4A to 4C are diagrams illustrating a method for manufacturing the MOSFET shown in FIG. 1.

As shown in FIG. 4A, the substrate 1 having the N$^+$ conductive type is prepared. The drift layer 2 is epitaxially grown on the principal surface of the substrate 1. The impurity concentration of the drift layer 2 is, for example, $1 \times 10^{16}$ cm$^{-3}$, and the thickness of the drift layer 2 is, for example, 10 μm.

Figure 4B:
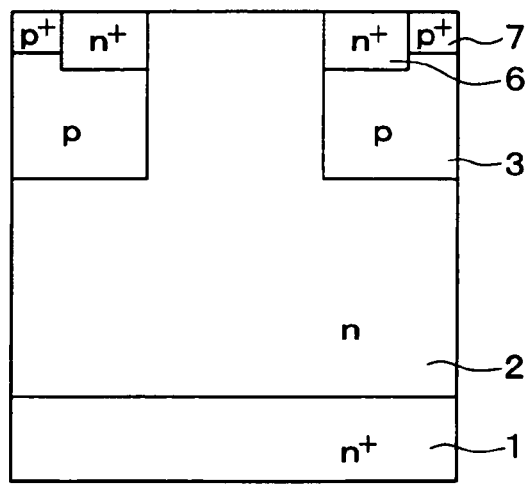

As shown in FIG. 4B, a mask made of LTO or the like is formed on the surface of the drift layer 2. The mask is patterned by a photo lithography method. Then, an ion is implanted through the mask. These steps are repeated so that the base region 3, the source region 6 and the contact layer 7 are formed. Here, the source region 6 and the contact layer 7 are also formed in these steps. Alternatively, the source region and the contact layer 7 may be formed after the trench 5 is formed.

Figure 4C:
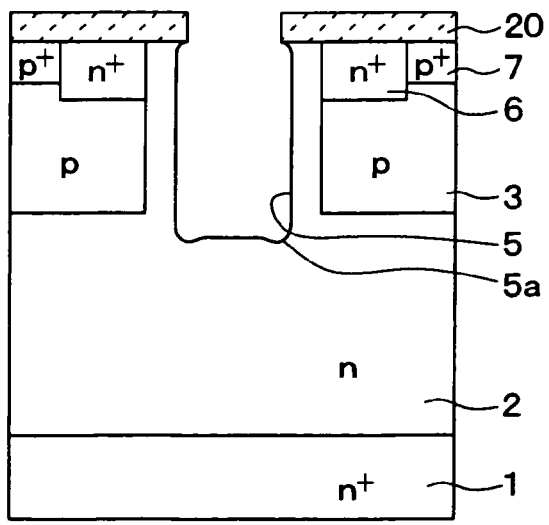

As shown in FIG. 4C, a mask 20 is formed on the surface of the drift layer 2 including the surface of the source region 6 and the surface of the contact layer 7. The mask 20 is made of a resist film or an oxide film such as a LTO film. Preferably, the mask 20 may be the oxide film so that the oxide film functions as a mask for a latter ion implantation step for forming the P conductive type bottom layer 4.

A part of the mask 20 corresponding to a bottom-P-conductive-type-to-be-formed region is removed. Then, the trench 5 is formed by an ICP (inductive coupled plasma) etching method. When the trench 5 is formed by the ICP etching method, the corner 5a of the bottom of the trench 5 is deeply removed, compared with a center portion of the bottom of the trench 5.

Figure 5A:
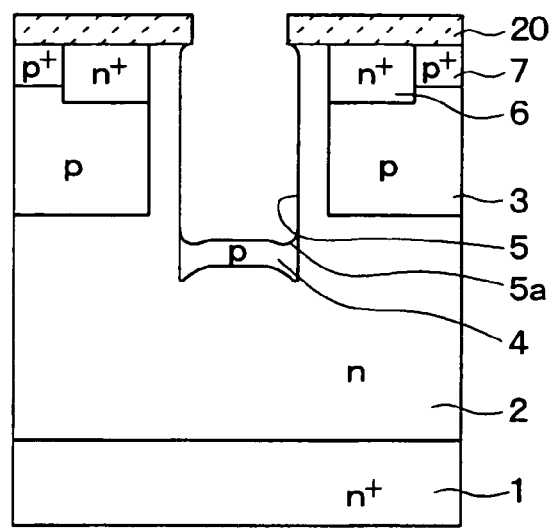
FIG. 5A to 5C are diagrams illustrating the method for manufacturing the MOSFET shown in FIG. 1.

As shown in FIG. 5A, the mask 20 is used for the ion implantation process, so that a P conductive type impurity such as aluminum is implanted through the mask 20. Then, the implanted ion is activated, so that the P conductive type bottom layer 4 is formed. Thus, the shape of the P conductive type bottom layer 4 corresponds to the shape of the bottom of the trench 5, so that a part of the P conductive type bottom layer 4 at the corner 5a of the trench 5 is deeper than another part of the P conductive type bottom layer 4 at the center portion of the bottom of the trench 5. Here, the center portion of the bottom of the trench 5 is disposed inside of the corner 5a of the bottom of the trench 5.

Figure 5B:
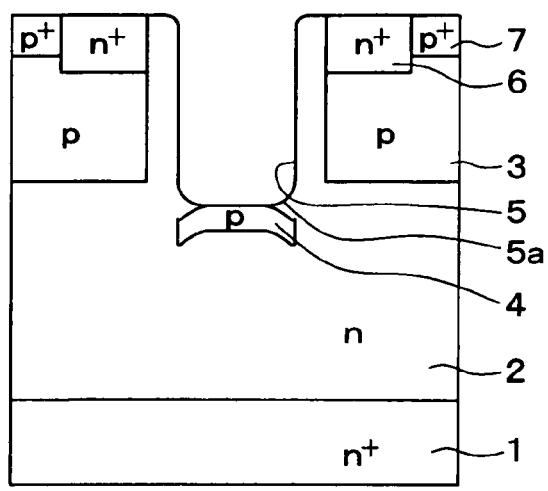

As shown in FIG. 5B, after the mask 20 is removed, the corner 5a of the trench 5 is rounded in a rounding step. For example, a hydrogen anneal process, a sacrifice oxidation process, a CD (chemical dry) process or the like is performed in the rounding step. Thus, a part of the drift layer 2 on the inner wall of the trench 5 is fluidized so that a N conductive type layer is formed on the P conductive type bottom layer 4 at the corner 5a of the trench 5. Thus, the N conductive type layer covers at least a part of the P conductive type bottom layer 4 at the corner 5a of the trench 5. Preferably, when the hydrogen anneal process is performed in the rounding step, the N conductive type layer with a large amount is formed on the bottom of the trench 5.

Figure 5C:
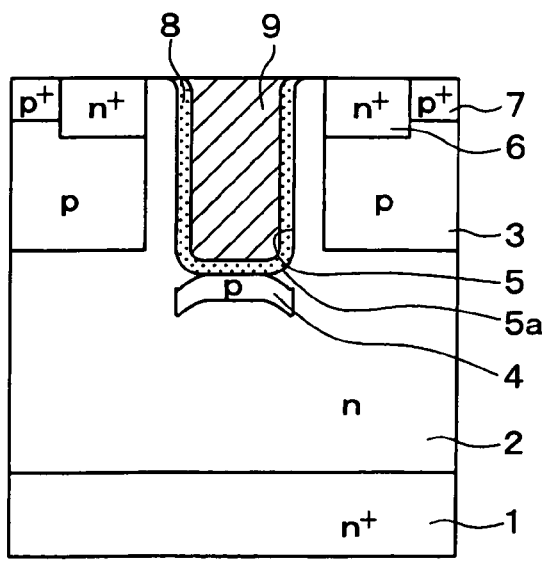

As shown in FIG. 5C, a thermal processing is performed to form the gate oxide film 8. Specifically, the pyrogenic method with using wet atmosphere is performed so that the gate oxide film 8 is formed. Then, a poly silicon layer is formed on the surface of the gate oxide film 8 at 600° C. The poly silicon layer has a N conductive type impurity and a thickness of 440 nm. A photo resist as a mask is patterned by a photo lithography method so that the poly silicon layer and the gate oxide film 8 are patterned. Thus, the gate oxide film 8 and the gate electrode 9 are formed in the trench 5.

After that, the interlayer insulation film 10 is formed, and the interlayer insulation film 10 is patterned so that the contact hole 11 for connecting to the source region 6 and the contact layer 7 is formed. Further, the other contact hole for connecting to the gate electrode 9 is formed at a position different from the contact hole 11. An electrode material is formed to fill the contact hole 11, and the electrode material is patterned so that the source electrode 12 and the gate wiring (not shown) are formed. The drain electrode 13 made of, for example, Ni is formed on the backside of the substrate 1. Thus, the MOSFET shown in FIG. 1 is completed.

Second Embodiment

A MOSFET according to a second embodiment has a P conductive type bottom layer 4, which is different from the first embodiment.

Figure 6:
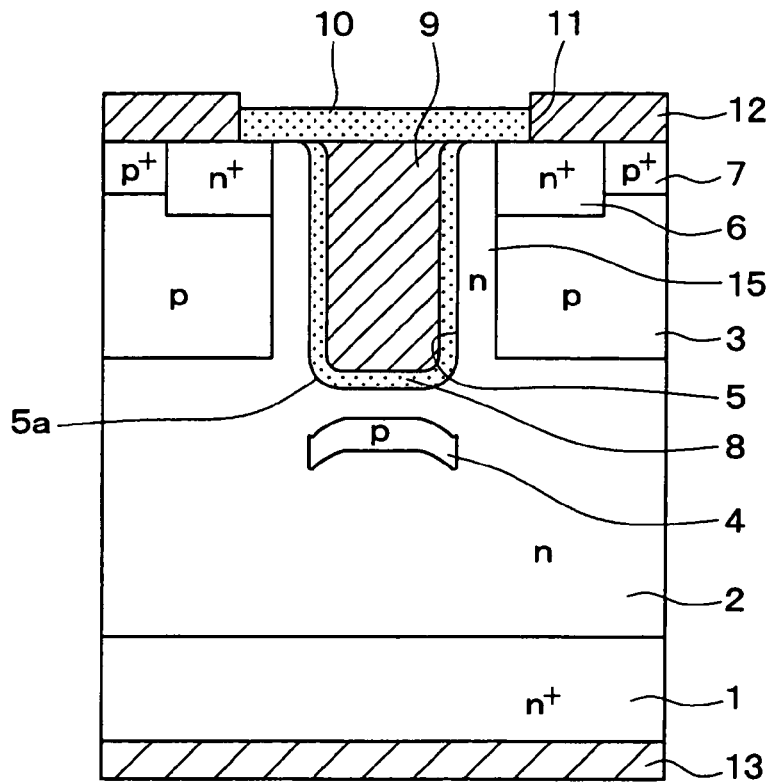
FIG. 6 is a diagram illustrating a cross sectional view of an accumulation type MOSFET according to a second embodiment.

FIG. 6 shows the MOSFET according to the second embodiment. Although the MOSFET shown in FIG. 1 the center portion of the P conductive type bottom layer 4 inside the corner 5a of the trench contacts the gate oxide film 8, the MOSFET shown in FIG. 6 has the P conductive type bottom layer 4 separated from the gate oxide film 8.

In the MOSFET, the part of the P conductive type bottom layer 4 disposed under the corner 5a of the trench 5 is deeper than the center portion of the P conductive type bottom layer 4 inside the corner 5a of the trench 5. A whole of the P conductive type bottom layer 4 is spaced apart from the gate oxide film 8. Accordingly, the top of the depletion layer extending from the P conductive type bottom layer 4 to the drift layer 2 becomes lower, i.e., deeper. Thus, when the SiC semiconductor device has the P conductive type bottom layer 4 under the bottom of the trench 5, the on state resistance is limited from increasing.

This MOSFET is manufactured such that the N conductive type layer is sufficiently formed on the P conductive type bottom layer 4 in the step shown in FIG. 5B so that the N conductive type layer covers the surface of the P conductive type bottom layer 4. In this case, it is preferred that the hydrogen anneal process is performed in this step.

Third Embodiment

Figure 7:
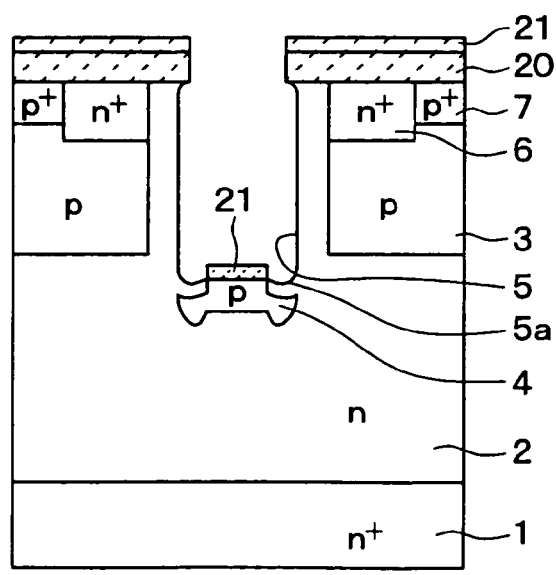
FIG. 7 is a diagram illustrating a method for manufacturing an accumulation type MOSFET according to a third embodiment.

FIG. 7 shows a manufacturing method of a MOSFET according to a third embodiment.

Firstly, the steps shown in FIGS. 4A to 4C are performed. Then, in FIG. 7, without removing the mask 20, a second mask 21 is formed on the surface of the drift layer 2, the surface of the source region 6 and the surface of the contact layer 7. A part of the second mask 21 disposed at the corner 5a of the trench 5 is removed. Then, a P conductive type impurity is implanted through the masks 20 and 21, and the P conductive type impurity is activated so that the P conductive type bottom layer 4 is formed.

In the above step, an ion implantation range is set to penetrate from the surface so that the P conductive type impurity is implanted at a predetermined depth from the surface. The P conductive type impurity is not disposed on the surface. Thus, the part of the P conductive type bottom layer 4 at the corner 5a of the trench 5 is spaced apart form the bottom of the trench 5. The part of the P conductive type bottom layer 4 corresponding to the corner 5a of the bottom of the trench 5 is disposed lower, i.e., deeper than the center portion of the P conductive type bottom layer 4 corresponding to a center portion of the bottom of the trench 5. When the ion implantation range is short, the center portion of the P conductive type bottom layer 4 contacts the gate oxide film 8. When the ion implantation range is long, the P conductive type bottom layer 4 is spaced apart form the gate oxide film 8.

After that, the masks 20, 21 are removed, the steps shown in FIGS. 5B and 5C are performed. Thus, the MOSFETS shown in FIGS. 1 and 6 are completed. Here, the shape of the P conductive type bottom layer corresponds to the shape of the second mask 21, and therefore, the shape of the P conductive type bottom layer according to the third embodiment may be slightly different from the shapes in FIGS. 1 and 6.

However, the essential features according to this embodiment are substantially the same as the first and second embodiments.

Fourth Embodiment

Figure 8A:
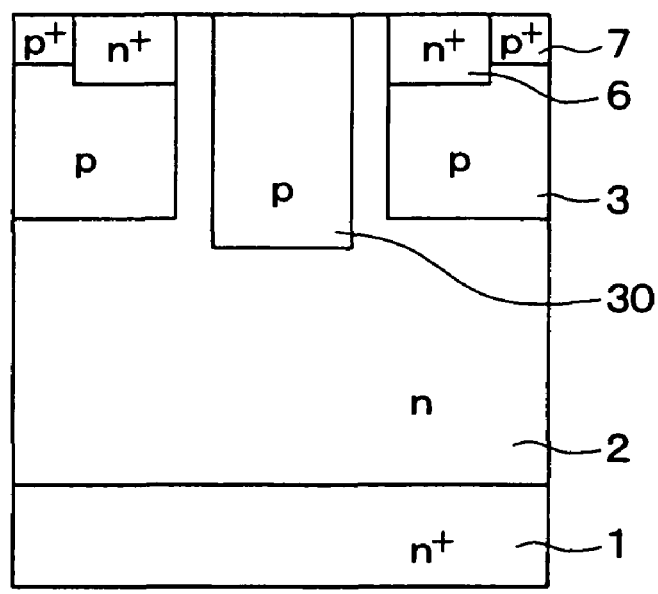
FIGS. 8A and 8B are diagrams illustrating a method for manufacturing an accumulation type MOSFET according to a fourth embodiment.
Figure 8B:
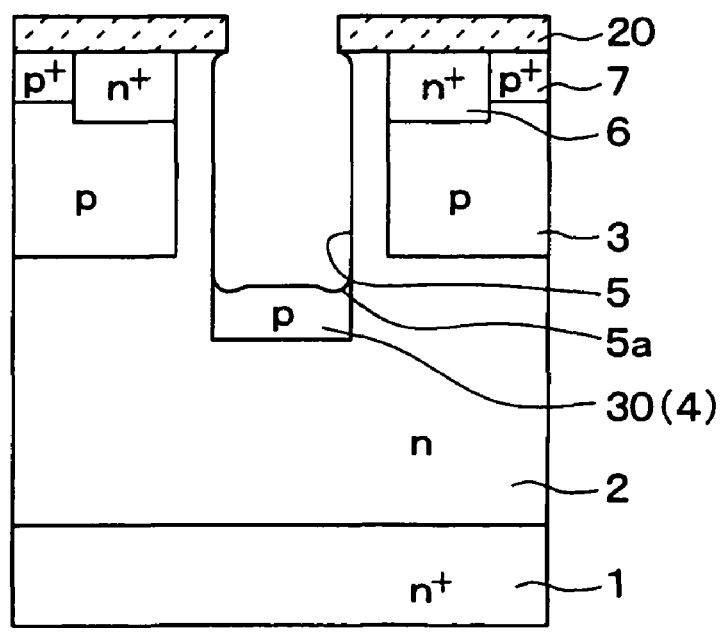

FIGS. 8A and 8B show a manufacturing method of a MOSFET according to a fourth embodiment.

First, the step shown in FIG. 4A is performed so that the drift layer 2 is formed on the principal surface of the substrate 1. Then, in the step in FIG. 8A, the base region 3, the source region 6 and the contact layer 7 in addition to the P conductive type layer 30 are formed. The P conductive type layer 30 may be formed in any order of the steps for forming the base region 3, the source region 6 and the contact layer 7. For example, the P conductive type layer 30 may be formed before the base region 3 is formed. The forming position of the P conductive type layer 30 is substantially the same as the trench 5 such that the P conductive type layer 30 is deeper by the P conductive type bottom layer 4 than the bottom of the trench 5.

In FIG. 8B, similar to the step shown in FIG. 4C, the trench 5 is formed in the P conductive type layer 30. In this case, since the P conductive type layer 30 is deeper than the trench 5, a part of the P conductive type layer 30 remains on the bottom of the trench 5 so that the part of the P conductive type layer 30 provides the P conductive type bottom layer 4.

Then, the steps shown in FIGS. 5A to 5C are performed so that the MOSFET shown in FIGS. 1 and 6 are completed. In the present embodiment, the bottom of the P conductive type bottom layer 4 is flat, and therefore, the shape of the P conductive type bottom layer according to the fourth embodiment may be slightly different from the shapes in FIGS. 1 and 6. However, the essential features according to this embodiment are substantially the same as the first and second embodiments.

Fifth Embodiment

Figure 9A:
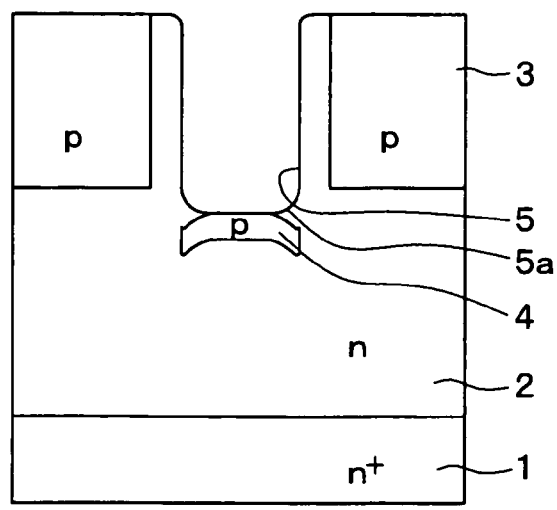
FIGS. 9A and 9C are diagrams illustrating a method for manufacturing an accumulation type MOSFET according to a fifth embodiment.
Figure 9B:
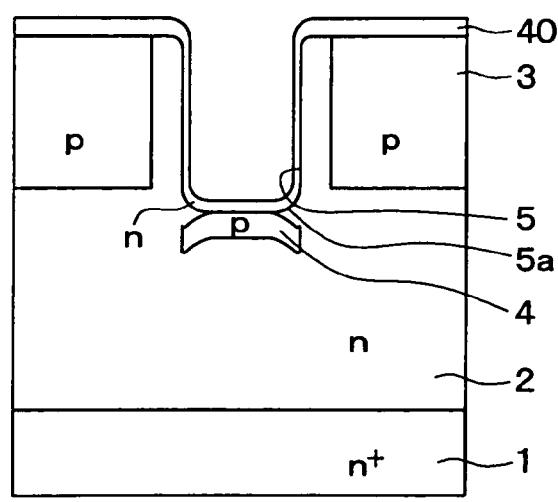
Figure 9C:
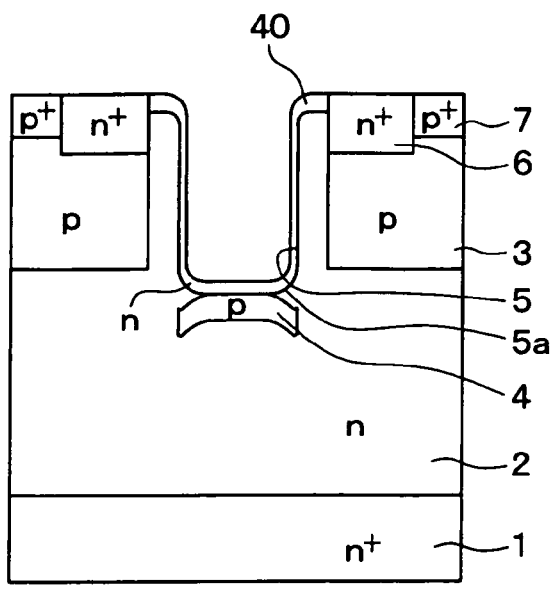

FIGS. 9A to 9C show a manufacturing method of a MOSFET according to a fifth embodiment.

First, the step shown in FIG. 4A is performed so that the drift layer 2 is formed on the principal surface of the substrate 1. Then, in FIG. 9A, the base region 3 is formed. Before the source region 6 and the contact layer 7 are formed, the trench 5 is formed and the corner 5a of the trench 5 is rounded, as shown in FIGS. 4C, 5A and 5B.

In FIG. 9B, a N conductive type layer 40 having a predetermined thickness is epitaxially grown in the trench 5. The thickness of the N conductive type layer 40 on the bottom of the trench 5 may be controlled to be thicker than that on the sidewall of the trench 5 by controlling a deposition condition and by utilizing a deposition rate dependency on a surface orientation. In this case, a deposition rate of the N conductive type layer 40 on the bottom of the trench 5 is higher than that on the sidewall of the trench 5. Thus, the N conductive type layer 40 covers the surface of the P conductive type bottom layer 4.

Then, in FIG. 9C, similar to the step shown in FIG. 4B, the source region 6 and the contact layer 7 are formed to penetrate the N conductive type layer 40 and to reach the base region 3.

Then, the step in FIG. 5C is performed so that the MOSFET in FIG. 6 is completed. Although the N conductive type layer 40 is formed after the corner 5a of the trench 5 is rounded, the N conductive type layer 40 may be formed without rounding the corner 5a of the trench 5 since the N conductive type layer 40 provides the trench 5 with a rounded corner 5a.

Sixth Embodiments

Although the SiC semiconductor device is the accumulation type MOSFET, the SiC semiconductor device may be an inversion type MOSFET.

Figure 10:
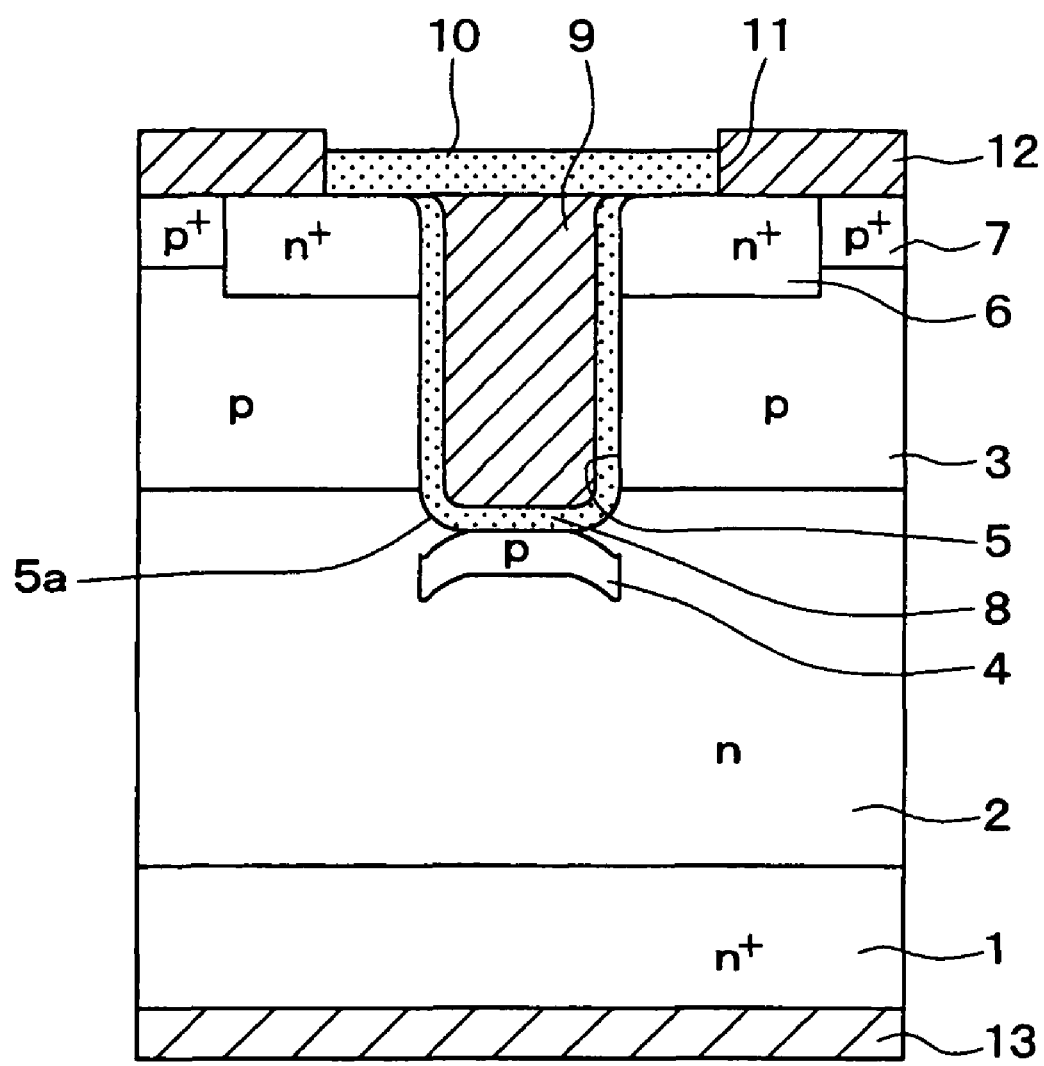
FIG. 10 is a diagram illustrating a method for manufacturing an inversion type MOSFET according to a sixth embodiment.

FIG. 10 shows an inversion type MOSFET according to another embodiment. The base region 3 and the source region 6 contact the sidewall of the trench 5. The trench 5 penetrates the base region 3 and the source region 6 and reaches the drift layer 2. When a voltage is applied to the gate electrode 9, a part of the base region 3 contacting the sidewall of the trench 5 functions as an inversion channel so that current flows between the source region 6, the drift layer 2 and the substrate 1. Thus, even when the SiC semiconductor device is the inversion type MOSFET, the on state resistance is improved.

Other Embodiments

In case of the inversion type MOSFET, the base region 3 may be formed by an epitaxialy growth method instead of an ion implantation method.

In the MOSFET shown in FIG. 6, the base region 3 may be formed by an epitaxial growth method. The base region 3 is epitaxially grown, and then, the trench is formed by the steps shown in FIGS. 9A to 9C. In this case, the N conductive type layer 40 is formed on an inner wall of the trench 5. The N conductive type layer 40 provides the channel 15 in FIG. 6. Thus, the MOSFET according to the second embodiment is completed.

In the accumulation type MOSFET, the source region 6 is spaced apart from the sidewall of the trench 5. Alternatively, the source region 6 may contact the sidewall of the trench 5. Specifically, the source region 6 is arranged opposite to the drift layer 2 via the channel 15 and the base region 3.

The SiC semiconductor device is the N channel type MOSFET so that the N conductive type functions as the first conductive type, and the P conductive type functions as the second conductive type. Alternatively, the SiC semiconductor device may be a P channel type MOSFET so that the N conductive type functions as the second conductive type, and the P conductive type functions as the first conductive type.

The above disclosure has the following aspects.

According to a first aspect of the present disclosure, a SiC semiconductor device having an accumulation type MOSFET includes: a substrate having a first conductive type and made of SiC; a drift layer having the first conductive type and made of SiC, wherein the drift layer is disposed on the substrate, and has an impurity concentration lower than an impurity concentration of the substrate; a trench disposed on a surface of the drift layer; a base region having a second conductive type and made of SiC, wherein the base region is disposed in a surface portion of the drift layer, and sandwiches the trench; a channel having the first conductive type and made of SiC, wherein the channel is disposed between the base region and a sidewall of the trench; a source region having the first conductive type and made of SiC, wherein the source region is disposed in a surface portion of the base region, and sandwiches the trench via the channel; a gate insulation film disposed on an inner wall of the trench; a gate electrode disposed in the trench via the gate insulation film; a source electrode electrically coupled with the source region; a drain electrode disposed on the substrate opposite to the drift layer; and a bottom layer having the second conductive type and made of SiC, wherein the bottom layer is disposed under the trench. The MOSFET flows current between the source electrode and the drain electrode via the source region, the channel and the drift layer by controlling a voltage to be applied to the gate electrode. The bottom layer includes an edge portion and a center portion. The edge portion of the bottom layer is disposed under a corner of a bottom of the trench, and the center portion of the bottom layer is disposed under a center portion of the bottom of the trench. The edge portion of the bottom layer is deeper than the center portion of the bottom layer.

In the above device, a top of a depletion layer extending from the edge portion of the bottom layer to the drift layer becomes deeper, so that a distance between the depletion layer extending from the bottom layer to the drift layer and a depletion layer extending from the base region to the drift layer becomes wide. Therefore, even when a protrusion amount is small, an on state resistance is limited from increasing. Thus, the SiC semiconductor device has a small on state resistance.

Alternatively, the center portion of the bottom layer may contact the center portion of the bottom of the trench. Alternatively, the bottom layer may be spaced apart from the bottom of the trench.

According to a second aspect of the present disclosure, a SiC semiconductor device having an inversion type MOSFET includes: a substrate having a first conductive type and made of SiC; a drift layer having the first conductive type and made of SiC, wherein the drift layer is disposed on the substrate, and has an impurity concentration lower than an impurity concentration of the substrate; a trench disposed on a surface of the drift layer; a base region having a second conductive type and made of SiC, wherein the base region is disposed in a surface portion of the drift layer, and sandwiches the trench to contact a sidewall of the trench; a source region having the first conductive type and made of SiC, wherein the source region is disposed in a surface portion of the base region, and sandwiches the trench to contact the sidewall of the trench; a gate insulation film disposed on an inner wall of the trench; a gate electrode disposed in the trench via the gate insulation film; a source electrode electrically coupled with the source region; a drain electrode disposed on the substrate opposite to the drift layer; and a bottom layer having the second conductive type and made of SiC, wherein the bottom layer is disposed under the trench. The MOSFET provides a channel in a part of the base region contacting the sidewall of the trench by controlling a voltage to be applied to the gate electrode. The MOSFET flows current between the source electrode and the drain electrode via the source region, the channel and the drift layer. The bottom layer includes an edge portion and a center portion. The edge portion of the bottom layer is disposed under a corner of a bottom of the trench, and the center portion of the bottom layer is disposed under a center portion of the bottom of the trench. The edge portion of the bottom layer is deeper than the center portion of the bottom layer.

In the above device, even when a protrusion amount is small, an on state resistance is limited from increasing. Thus, the SiC semiconductor device has a small on state resistance.

Alternatively, the center portion of the bottom layer may contact the center portion of the bottom of the trench. Alternatively, the bottom layer may be spaced apart from the bottom of the trench.

According to a third aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a plurality of base regions in a surface portion of the drift layer by implanting a second conductive type impurity on the surface portion of the drift layer, wherein each base region has a second conductive type, and the plurality of base regions is spaced apart from each other; forming a source region in a surface portion of each base region, wherein the source region having the first conductive type and made of SiC has an impurity concentration higher than the impurity concentration of the drift layer; forming a trench on a surface of the drift layer by an ICP etching method, wherein the trench is disposed between the plurality of the base regions, and spaced apart from each base region, and the trench is deeper than the base region; forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer; covering at least the edge portion of the bottom layer with a first conductive type SiC material; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

Alternatively, in the covering at least the edge portion of the bottom layer, the first conductive type SiC material may cover a whole of the bottom layer. Alternatively, in the covering at least the edge portion of the bottom layer, the first conductive type SiC material may be epitaxially grown to cover a whole of the bottom layer. Alternatively, in the covering at least the edge portion of the bottom layer, the center portion of the bottom layer may be exposed from the first conductive type SiC material.

According to a fourth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a plurality of base regions in a surface portion of the drift layer by implanting a second conductive type impurity on the surface portion of the drift layer, wherein each base region has a second conductive type, and the plurality of base regions is spaced apart from each other; forming a source region in a surface portion of each base region, wherein the source region having the first conductive type and made of SiC has an impurity concentration higher than the impurity concentration of the drift layer; forming a trench on a surface of the drift layer by an ICP etching method, wherein the trench is disposed between the plurality of the base regions, and spaced apart from each base region, and the trench is deeper than the base region; forming a mask on the bottom of the trench, wherein a corner of a bottom of the trench is exposed from the mask, and the mask covers a center portion of the bottom of the trench; forming a bottom layer under the trench by implanting a second conductive type impurity through the mask, wherein the bottom layer has the second conductive type and includes an edge portion and a center portion, the edge portion of the bottom layer is disposed under the corner of the bottom of the trench, the center portion of the bottom layer is disposed under the center portion of the bottom of the trench, and the edge portion of the bottom layer is deeper than the center portion of the bottom layer; removing the mask; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

Alternatively, the method may further include: covering at least the edge portion of the bottom layer with a first conductive type SiC material after the removing the mask. Further, in the covering at least the edge portion of the bottom layer, the center portion of the bottom layer may be exposed from the first conductive type SiC material. Alternatively, in the covering at least the edge portion of the bottom layer, the first conductive type SiC material covers a whole of the bottom layer. Alternatively, in the covering at least the edge portion of the bottom layer, the first conductive type SiC material is epitaxially grown to cover a whole of the bottom layer.

According to a fifth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a bottom layer in a surface portion of the drift layer by implanting a second conductive type impurity on the drift layer, wherein the bottom layer has a second conductive type and a predetermined depth from the surface of the drift layer; forming a plurality of base regions in another surface portion of the drift layer by implanting the second conductive type impurity on the drift layer, wherein each base region has the second conductive type, the plurality of base regions sandwiches the bottom layer, each base region is spaced apart from the bottom layer, and the base region is shallower than the bottom layer; forming a source region in a surface portion of each base region, wherein the source region having the first conductive type and made of SiC has an impurity concentration higher than the impurity concentration of the drift layer; forming a trench on the surface portion of the drift layer by an ICP etching method so that a part of the bottom layer is removed and a remaining part of the bottom layer is disposed under the trench, wherein the trench is disposed between the plurality of the base regions, and spaced apart from each base region, and the trench is deeper than the base region; covering at least an edge portion of the bottom layer with a first conductive type SiC material, wherein the edge portion of the bottom layer is disposed under a corner of a bottom of the trench; forming a gate insulation film on an inner wall of the trench; forming a gate electrode in the trench via the gate insulation film; forming a source electrode electrically coupled with the source region; and forming a drain electrode on the substrate opposite to the drift layer. The bottom layer further includes a center portion, the center portion of the bottom layer is disposed under a center portion of the bottom of the trench, and the edge portion of the bottom layer is deeper than the center portion of the bottom layer.

The above method provides the SiC semiconductor device such that even when a protrusion amount is small, an on state resistance is limited from increasing. Thus, the SiC semiconductor device has a small on state resistance.

Alternatively, in the covering at least the edge portion of the bottom layer, the first conductive type SiC material may cover a whole of the bottom layer. Alternatively, in the covering at least the edge portion of the bottom layer, the first conductive type SiC material is epitaxially grown to cover a whole of the bottom layer. Alternatively, in the covering at least the edge portion of the bottom layer, the center portion of the bottom layer is exposed from the first conductive type SiC material.

According to a sixth aspect of the present disclosure, a method for manufacturing a SiC semiconductor device includes: forming a drift layer on a substrate, wherein the substrate has a first conductive type and made of SiC, the drift layer has the first conductive type and made of SiC, and the drift layer has an impurity concentration lower than an impurity concentration of the substrate; forming a base region in a surface portion of the drift layer, wherein the base region has a second conductive type; forming a source region in a surface portion of the base region, wherein the source region having the first conductive type and made of SiC has an impurity concentration higher than the impurity concentration of the drift layer; forming a trench on a surface of the drift layer by an ICP etching method, wherein the trench penetrates the base region and the source region and reaches the drift layer; forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer; covering at least the edge portion of the bottom layer with a first conductive type SiC material; forming a gate insulation film on an inner wall of the trench; forming a gate electrode in the trench via the gate insulation film; forming a source electrode electrically coupled with the source region; and forming a drain electrode on the substrate opposite to the drift layer.

The above method provides the SiC semiconductor device such that even when a protrusion amount is small, an on state resistance is limited from increasing. Thus, the SiC semiconductor device has a small on state resistance.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device having an accumulation type MOSFET comprising:
   a substrate having a first conductive type and made of SiC;
   a drift layer having the first conductive type and made of SiC, wherein the drift layer is disposed on the substrate, and has an impurity concentration lower than an impurity concentration of the substrate;
   a trench disposed on a surface of the drift layer;
   a base region having a second conductive type and made of SiC, wherein the base region is disposed in a surface portion of the drift layer, and sandwiches the trench;
   a channel having the first conductive type and made of SiC, wherein the channel is disposed between the base region and a sidewall of the trench;
   a source region having the first conductive type and made of SiC, wherein the source region is disposed in a surface portion of the base region, and sandwiches the trench via the channel;

a gate insulation film disposed on an inner wall of the trench;

a gate electrode disposed in the trench via the gate insulation film;

a source electrode electrically coupled with the source region;

a drain electrode disposed on the substrate opposite to the drift layer; and a bottom layer having the second conductive type and made of SiC, wherein the bottom layer is disposed under the trench, wherein the MOSFET flows current between the source electrode and the drain electrode via the source region, the channel and the drift layer by controlling a voltage to be applied to the gate electrode, wherein the bottom layer includes an edge portion and a center portion, wherein the edge portion of the bottom layer is disposed under a corner of a bottom of the trench, and the center portion of the bottom layer is disposed under a center portion of the bottom of the trench, and wherein the edge portion of the bottom layer is deeper than the center portion of the bottom layer.

2. The device according to claim 1, wherein
the center portion of the bottom layer contacts the center portion of the bottom of the trench.

3. The device according to claim 1, wherein
the bottom layer is spaced apart from the bottom of the trench.

4. A SiC semiconductor device having an inversion type MOSFET comprising:

a substrate having a first conductive type and made of SiC;

a drift layer having the first conductive type and made of SiC, wherein the drift layer is disposed on the substrate, and has an impurity concentration lower than an impurity concentration of the substrate;

a trench disposed on a surface of the drift layer;

a base region having a second conductive type and made of SiC, wherein the base region is disposed in a surface portion of the drift layer, and sandwiches the trench to contact a sidewall of the trench;

a source region having the first conductive type and made of SiC, wherein the source region is disposed in a surface portion of the base region, and sandwiches the trench to contact the sidewall of the trench;

a gate insulation film disposed on an inner wall of the trench;

a gate electrode disposed in the trench via the gate insulation film;

a source electrode electrically coupled with the source region;

a drain electrode disposed on the substrate opposite to the drift layer; and a bottom layer having the second conductive type and made of SiC, wherein the bottom layer is disposed under the trench, wherein the MOSFET provides a channel in a part of the base region contacting the sidewall of the trench by controlling a voltage to be applied to the gate electrode, wherein the MOSFET flows current between the source electrode and the drain electrode via the source region, the channel and the drift layer, wherein the bottom layer includes an edge portion and a center portion, wherein the edge portion of the bottom layer is disposed under a corner of a bottom of the trench, and the center portion of the bottom layer is disposed under a center portion of the bottom of the trench, and wherein the edge portion of the bottom layer is deeper than the center portion of the bottom layer.

5. The device according to claim 4, wherein
the center portion of the bottom layer contacts the center portion of the bottom of the trench.

6. The device according to claim 4, wherein
the bottom layer is spaced apart from the bottom of the trench.

7. A method for manufacturing a SiC semiconductor device comprising:

forming a drift layer on a substrate, wherein the substrate has a first conductive type and made of SiC, the drift layer has the first conductive type and made of SiC, and the drift layer has an impurity concentration lower than an impurity concentration of the substrate;

forming a plurality of base regions in a surface portion of the drift layer by implanting a second conductive type impurity on the surface portion of the drift layer, wherein each base region has a second conductive type, and the plurality of base regions is spaced apart from each other;

forming a source region in a surface portion of each base region, wherein the source region having the first conductive type and made of SiC has an impurity concentration higher than the impurity concentration of the drift layer;

forming a trench on a surface of the drift layer by an ICP etching method, wherein the trench is disposed between the plurality of the base regions, and spaced apart from each base region, and the trench is deeper than the base region;

forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer;

covering at least the edge portion of the bottom layer with a first conductive type SiC material;

forming a gate insulation film on an inner wall of the trench;

forming a gate electrode in the trench via the gate insulation film;

forming a source electrode electrically coupled with the source region; and forming a drain electrode on the substrate opposite to the drift layer.

8. The method according to claim 7, wherein,
in the covering at least the edge portion of the bottom layer, the first conductive type SiC material covers a whole of the bottom layer.

9. The method according to claim 7, wherein,
in the covering at least the edge portion of the bottom layer, the first conductive type SiC material is epitaxially grown to cover a whole of the bottom layer.

10. The method according to claim 7, wherein,
in the covering at least the edge portion of the bottom layer, the center portion of the bottom layer is exposed from the first conductive type SiC material.

11. A method for manufacturing a SiC semiconductor device comprising:

forming a drift layer on a substrate, wherein the substrate has a first conductive type and made of SiC, the drift layer has the first conductive type and made of SiC, and the drift layer has an impurity concentration lower than an impurity concentration of the substrate;

forming a plurality of base regions in a surface portion of the drift layer by implanting a second conductive type impurity on the surface portion of the drift layer, wherein each base region has a second conductive type, and the plurality of base regions is spaced apart from each other;

forming a source region in a surface portion of each base region, wherein the source region having the first conductive type and made of SiC has an impurity concentration higher than the impurity concentration of the drift layer;

forming a trench on a surface of the drift layer by an ICP etching method, wherein the trench is disposed between the plurality of the base regions, and spaced apart from each base region, and the trench is deeper than the base region;

forming a mask on the bottom of the trench, wherein a corner of a bottom of the trench is exposed from the mask, and the mask covers a center portion of the bottom of the trench;

forming a bottom layer under the trench by implanting a second conductive type impurity through the mask, wherein the bottom layer has the second conductive type and includes an edge portion and a center portion, the edge portion of the bottom layer is disposed under the corner of the bottom of the trench, the center portion of the bottom layer is disposed under the center portion of the bottom of the trench, and the edge portion of the bottom layer is deeper than the center portion of the bottom layer;

removing the mask;

forming a gate insulation film on an inner wall of the trench;

forming a gate electrode in the trench via the gate insulation film;

forming a source electrode electrically coupled with the source region; and forming a drain electrode on the substrate opposite to the drift layer.

12. The method according to claim 11, further comprising:
covering at least the edge portion of the bottom layer with a first conductive type SiC material after the removing the mask.

13. The method according to claim 12, wherein,
in the covering at least the edge portion of the bottom layer, the center portion of the bottom layer is exposed from the first conductive type SiC material.

14. The method according to claim 12, wherein, in the covering at least the edge portion of the bottom layer, the first conductive type SiC material covers a whole of the bottom layer.

15. The method according to claim 12, wherein, in the covering at least the edge portion of the bottom layer, the first conductive type SiC material is epitaxially grown to cover a whole of the bottom layer.

16. A method for manufacturing a SiC semiconductor device comprising:
forming a drift layer on a substrate, wherein the substrate has a first conductive type and made of SiC, the drift layer has the first conductive type and made of SiC, and the drift layer has an impurity concentration lower than an impurity concentration of the substrate;

forming a bottom layer in a surface portion of the drift layer by implanting a second conductive type impurity on the drift layer, wherein the bottom layer has a second conductive type and a predetermined depth from the surface of the drift layer;

forming a plurality of base regions in another surface portion of the drift layer by implanting the second conductive type impurity on the drift layer, wherein each base region has the second conductive type, the plurality of base regions sandwiches the bottom layer, each base region is spaced apart from the bottom layer, and the base region is shallower than the bottom layer;

forming a source region in a surface portion of each base region, wherein the source region having the first conductive type and made of SiC has an impurity concentration higher than the impurity concentration of the drift layer;

forming a trench on the surface portion of the drift layer by an ICP etching method so that a part of the bottom layer is removed and a remaining part of the bottom layer is disposed under the trench, wherein the trench is disposed between the plurality of the base regions, and spaced apart from each base region, and the trench is deeper than the base region;

covering at least an edge portion of the bottom layer with a first conductive type SiC material, wherein the edge portion of the bottom layer is disposed under a corner of a bottom of the trench;

forming a gate insulation film on an inner wall of the trench;

forming a gate electrode in the trench via the gate insulation film;

forming a source electrode electrically coupled with the source region; and forming a drain electrode on the substrate opposite to the drift layer, wherein the bottom layer further includes a center portion, the center portion of the bottom layer is disposed under a center portion of the bottom of the trench, and the edge portion of the bottom layer is deeper than the center portion of the bottom layer.

17. The method according to claim 16, wherein,
in the covering at least the edge portion of the bottom layer, the first conductive type SiC material covers a whole of the bottom layer.

18. The method according to claim 16, wherein,
in the covering at least the edge portion of the bottom layer, the first conductive type SiC material is epitaxially grown to cover a whole of the bottom layer.

19. The method according to claim 16, wherein,
in the covering at least the edge portion of the bottom layer, the center portion of the bottom layer is exposed from the first conductive type SiC material.

20. A method for manufacturing a SiC semiconductor device comprising:
forming a drift layer on a substrate, wherein the substrate has a first conductive type and made of SiC, the drift layer has the first conductive type and made of SiC, and the drift layer has an impurity concentration lower than an impurity concentration of the substrate;

forming a base region in a surface portion of the drift layer, wherein the base region has a second conductive type;

forming a source region in a surface portion of the base region, wherein the source region having the first conductive type and made of SiC has an impurity concentration higher than the impurity concentration of the drift layer;

forming a trench on a surface of the drift layer by an ICP etching method, wherein the trench penetrates the base region and the source region and reaches the drift layer;

forming a bottom layer under the trench by implanting a second conductive type impurity, wherein the bottom layer has the second conductive type and includes an edge portion and a center portion, the edge portion of the bottom layer is disposed under a corner of a bottom of the trench, the center portion of the bottom layer is disposed under a center portion of the bottom of the trench, and the edge portion of the bottom layer is deeper than the center portion of the bottom layer;

covering at least the edge portion of the bottom layer with a first conductive type SiC material;

forming a gate insulation film on an inner wall of the trench;

forming a gate electrode in the trench via the gate insulation film;

forming a source electrode electrically coupled with the source region; and forming a drain electrode on the substrate opposite to the drift layer.

\* \* \* \* \*